United States Patent
Yeomans (10) Patent No.: US 9,729,104 B2
(45) Date of Patent: Aug. 8, 2017

(54) SOLAR POWER SYSTEMS

(71) Applicant: Allan James Yeomans, Surfers Paradise, Gold Coast, Queensland (AU)

(72) Inventor: Allan James Yeomans, Gold Coast (AU)

( * ) Notice: Subject to any disclaimer, the term of this patent is extended or adjusted under 35 U.S.C. 154(b) by 304 days.

(21) Appl. No.: 14/415,621

(22) PCT Filed: Jul. 31, 2013

(86) PCT No.: PCT/AU2013/000839
§ 371 (c)(1),
(2) Date: Jan. 19, 2015

(87) PCT Pub. No.: WO2014/019016
PCT Pub. Date: Feb. 6, 2014

(65) Prior Publication Data
US 2015/0155827 A1    Jun. 4, 2015

(30) Foreign Application Priority Data
Jul. 31, 2012    (AU) ................. 2012903264

(51) Int. Cl.
*H02S 40/42*    (2014.01)
*F24J 2/14*    (2006.01)
(Continued)

(52) U.S. Cl.
CPC ........... *H02S 40/425* (2014.12); *F24J 2/14* (2013.01); *F24J 2/18* (2013.01); *F24J 2/4638* (2013.01);
(Continued)

(58) Field of Classification Search
CPC ...... F24J 2/14; F24J 2/18; F24J 2/4638; F24J 2/5406; F24J 2/5269; H02S 40/425; H02S 20/00; H02S 20/30; H01L 31/0521
See application file for complete search history.

(56) References Cited

U.S. PATENT DOCUMENTS 3,875,926 A * 4/1975 Frank .................. C02F 1/14
                                                    122/366
4,143,643 A * 3/1979 Gerin ..................... F24J 2/0477
                                                    126/583
(Continued)

FOREIGN PATENT DOCUMENTS

| FR | 2 958 382 A1 | 10/2011 |
| WO | 93/09390 A1 | 5/1993 |
| WO | 99/46543 A1 | 9/1999 |

OTHER PUBLICATIONS

Written Opinion dated Sep. 10, 2013.

*Primary Examiner* — Golam Mowla
(74) *Attorney, Agent, or Firm* — Wood, Phillips, Katz, Clark & Mortimer (57) ABSTRACT

A solar power system (11) which comprises a plurality of solar energy collecting means (10,10a,10b,10c) respectively comprising a platform assembly (16,16a,16b,16c) floating on liquid in a liquid reservoir (14,14a,14b,14c), each platform assembly carrying solar energy concentrators or collectors and respective reservoirs (14,14a,14b,14c), being interconnected in series and arranged in a cascading relationship such that the flooding of a platform assembly (16,16a,16b,16c) in one reservoir (14,14a,14b,14c), for protection of the concentrators or collectors under liquid displaces liquid in that reservoir (14,14a,14b,14c), and causes the flooding of an adjacent lower platform assembly (16,16a,16b,16c) to protect the concentrators or collectors carried thereon.

20 Claims, 3 Drawing Sheets

(51) Int. Cl.
*F24J 2/18* (2006.01)
*F24J 2/46* (2006.01)
*F24J 2/52* (2006.01)
*F24J 2/54* (2006.01)
*H02S 20/00* (2014.01)
*H01L 31/052* (2014.01)
*H02S 20/30* (2014.01)

(52) U.S. Cl.
CPC ........... F24J 2/5269 (2013.01); F24J 2/5406 (2013.01); H01L 31/0521 (2013.01); H02S 20/00 (2013.01); H02S 20/30 (2014.12); *Y02E 10/45* (2013.01); *Y02E 10/47* (2013.01); *Y02E 10/50* (2013.01)

(56) References Cited

U.S. PATENT DOCUMENTS

| | | | |
|---|---|---|---|
| 4,170,222 A | | 10/1979 | Barker |
| 4,235,221 A | * | 11/1980 | Murphy .................... F03G 6/00 126/562 |
| 4,238,873 A | * | 12/1980 | Frank .................. F24D 17/0021 126/590 |
| 5,309,893 A | | 5/1994 | Yeomans |
| 5,592,932 A | | 1/1997 | Yeomans |
| 6,220,241 B1 | | 4/2001 | Yeomans |
| 6,406,155 B1 | | 6/2002 | Yeomans |
| 6,637,427 B1 | | 10/2003 | Yeomans |

\* cited by examiner

SOLAR POWER SYSTEMS

TECHNICAL FIELD

This invention relates to a solar power system and in particular to a system which comprises solar energy collecting apparatus of the type which floats on a body of liquid and which is adapted to track movement of the sun. The present invention is particularly applicable to solar energy collecting apparatus of the type disclosed in my Australian patents Nos. 671423 (PCT/AU92/00520) and 742755 (PCT/AU99/00140) but may be applied to other solar energy collecting apparatus.

BACKGROUND ART

In my International patent application No PCT/AU92/00520 (AU671423), I disclose radiant solar energy collecting apparatus which includes a platform assembly floating on a body of liquid usually water contained in a reservoir, the top side of the platform assembly supporting reflectors of a solar concentrator. In the apparatus disclosed in my International patent application No. PCT/AU99/00140 (AU742755), the platform assembly can also support photovoltaic cells and the underside of the platform assembly is provided with a series of compartments which are open on their lowermost sides and which contain air to provide buoyant lift to maintain the reflectors normally above the level of liquid in the reservoir. In an alternative arrangement, the platform assembly may be formed of or include a buoyant material. The platform assembly is rotatable about a vertical axis whilst floating on liquid in the reservoir to track movement of the sun to maintain efficient collection of solar energy throughout the day.

So as to prevent damage to the reflectors supported on the platform assembly, the platform assembly is capable of being flooded with liquid so that the reflectors are covered by a protective liquid layer. As described in my above patent application PCT/AU92/00520, to enable the platform assembly to be flooded, a pump is provided to pump liquid from beneath the platform assembly to the top side of the platform assembly. Alternatively, the platform assembly is provided with a plurality of impellers provided in ducts through the platform assembly, the impellers being capable of being driven by respective electric motors. Where a plurality of apparatuses are provided in one location associated with respective liquid reservoirs, it is necessary to provide flooding arrangements for each platform assembly which leads to complexity of the system and increased costs due to the necessity of providing liquid pumps for, and/or motor driven impellers on, each platform assembly.

In my International patent application No. PCT/AU99/00140 (AU742755), the arrangement for flooding the platform assembly which carriers reflectors or photovoltaic cells comprises means to vent the air compartments on the underside of the platform assembly to allow the platform assembly to be submerged in liquid in the reservoir. In some circumstances however, such an arrangement is not sufficient to submerge the platform assemblies rapidly which is required if there is a rapid onset of hail or other inclement weather conditions and thus a flooding system using pumps and/or impellers is preferred.

It would be desirable if an arrangement for flooding the platform assemblies of floating solar energy collecting apparatus of a solar power system was available which addressed one or more of the above disadvantages or which at least provided an alternative to the currently known arrangements.

SUMMARY OF INVENTION

The present invention thus provides in one aspect although not necessarily the broadest aspect, a solar power system comprising a plurality of solar energy collecting means, each said collecting means comprising a platform assembly floating on liquid in a liquid reservoir, said platform assembly carrying solar energy concentrators or collectors, and respective said reservoirs being arranged in a cascading relationship such that the liquid displaced by the flooding of a platform assembly for protection of said concentrators or collectors under liquid causes the flooding of an adjacent lower platform assembly.

Preferably the flooding of the platform assembly of the uppermost solar energy collecting means and thereby at least the partial submerging of that platform assembly in its associated reservoir causes the flooding and partial submerging of the platform assemblies of the respective lower solar collecting means in turn such that all platform assemblies are flooded sequentially.

Preferably the system includes an upper storage reservoir or dam which contains liquid for flooding the platform assembly of the uppermost solar collecting means. Alternatively the upper storage reservoir or dam may comprise the reservoir of the uppermost solar collecting means.

Preferably the system includes a lower storage reservoir or dam for storing liquid which is displaced from the reservoir of the lowermost solar collecting means. Alternatively the lower storage reservoir or dam may comprise the reservoir of the lowermost solar collecting means. Preferably selectively operable pump means are provided to return liquid from the lower storage reservoir or dam or reservoir of the lowermost solar energy collecting means to the upper storage reservoir or dam or the reservoir of the uppermost solar collecting means.

The pump means for pumping the liquid from the lower storage reservoir or dam to the upper storage reservoir or dam may comprise any suitable pump such as an electrically driven centrifugal pump.

Preferably respective ducts interconnect the reservoirs of the respective solar energy collecting means such that the liquid displaced by the flooding of a platform assembly can flow to the reservoir of next adjacent lower solar energy collecting means to flood the platform assembly therein.

In one form, the solar collectors or concentrators comprise reflectors or mirrors of solar energy collecting means which is adapted to generate superheated steam for supply to a steam turbine which uses the superheated steam to generate rotary motion to drive generator means. The generator means typically comprises an electrical generator for generation of electrical power.

In another form, the concentrators or collectors comprise a plurality of solar energy collectors in the form of photovoltaic cells for generating electrical current when subject to sunlight. For this purpose, the platform means may include on its upper surface a plurality of surfaces angled at the mean declination of the sun which varies according to the latitude of operation. Alternatively, the cells may be arranged so as to be mounted at a set or adjustable angle to the platform means.

Preferably the system also incorporates an impulse turbine which is adapted to generate rotary motion from water or liquid released from the upper storage reservoir or dam (or the reservoir of the uppermost solar collecting means). The impulse turbine may comprise a pelton wheel turbine. The impulse turbine may be selectively coupled to the generator means by any suitable transmission means. Alternatively the impulse turbine may be selectively coupled to auxiliary generator means.

Where the uppermost liquid reservoir comprises the upper storage reservoir or dam, means may be provided for selectively supplying liquid therein to the impulse turbine. Such means may comprise a valve controlled supply duct. Where the lowermost liquid reservoir comprises the lower liquid reservoir, means may be provided for selectively supplying liquid from the impulse turbine to the lowermost liquid reservoir. Such means may comprise a valve controlled supply duct.

The solar energy collecting means is suitably one of the types disclosed in my Australian patent Nos. 671423 and 742755 with the platform assembly floating on a body of water in a reservoir and carrying reflectors or concentrators for concentrating solar energy on a solar energy receiver for the generation of superheated steam or alternatively carrying photovoltaic cells. The solar energy collecting means however may comprise floating solar energy collecting apparatus other than of the type disclosed in my aforesaid patents.

In another aspect, the present invention provides solar energy collecting apparatus comprising a plurality of solar energy collecting means, each said collecting means comprising a platform assembly floating on liquid in a liquid reservoir, said platform assembly carrying solar energy concentrators, reflectors or collectors, respective reservoirs being positioned at differing elevations and being interconnected sequentially in a cascading relationship such that liquid displaced by the flooding of a platform assembly causes the flooding of at least an adjacent lower platform assembly to protect said concentrators, reflectors or collectors of said collecting means.

Preferably, the reservoirs of the apparatus are interconnected through respective ducts which direct liquid displaced from one reservoir to an adjacent lower reservoir and onto the platform assembly of the adjacent reservoir. The apparatus also suitably includes an upper reservoir for supplying liquid to the uppermost liquid reservoir of the plurality of solar energy collecting means. The apparatus may also include a lower reservoir for receiving liquid from the lowermost liquid reservoir of the plurality of solar energy collecting means. The lowermost liquid reservoir may be of a depth such that a said platform assembly therein seats on the bottom of the reservoir when receiving liquid from the adjacent upper liquid reservoir.

BRIEF DESCRIPTION OF DRAWINGS

Reference will now be made to the accompanying drawings which illustrate schematically a preferred embodiment of the invention and wherein.

DESCRIPTION OF EMBODIMENT

Referring to the drawings and firstly to FIGS. 1 and 2, there is illustrated schematically a solar energy collecting apparatus 10 of a type which can be used in a solar thermal electricity generating system or plant 11 (see FIG. 3) as described further below. The solar energy collecting apparatus 10 is of the type disclosed in my aforesaid international patent applications Nos. PCT/AU92/00153 and PCT/AU99/00140 and includes as shown schematically in FIG. 1, an array 12 of solar collecting assemblies 13 floating in liquid or water within a liquid or water reservoir 14. Each solar collecting assembly 13 comprises a rectangular buoyant platform 15 with the platforms 15 being interconnected in the array 12 to form a platform assembly 16 of a generally circular configuration which substantially occupies the surface area of the reservoir 14. The body of water or other liquid within the reservoir 14 acts as a bearing so that the platform assembly 16 may be rotated about a vertical axis at the centre of the array to enable the solar collecting assemblies 13 to track movement of the sun. The platforms 15 may be constructed of a buoyant material such as a foam plastics material or be mounted on a layer of such material. Alternatively, the platforms 15 may be formed with sealed or open air reservoirs or provided with other means to make them buoyant. In this latter configuration, the platforms 15 may be manufactured of concrete or any other material.

In each individual solar collecting assembly 13, the platform 15 supports on its top surface reflectors 17 typically comprising mirrors which form a primary parabolic concentrator to concentrate solar energy on a target 18, the target 18 in this embodiment comprises a secondary concentrating assembly which concentrates solar energy on ducts through which water/steam flows and which can be converted in the ducts to superheated steam by the concentrated solar energy. Superheated steam can be supplied to a steam turbine ST which can drive an electrical generator G1. The target 18 alternatively may comprise photovoltaic cells.

Extending around the outer periphery of the platform assembly 16 is an upstanding barrier or wall 19 which serves to constrain water on the platform assembly 16 for flooding the platform assembly 16 and submerging at least the reflectors 17 as described in my aforesaid patent applications and further below. The platforms 15 are connected together using suitable sealing arrangements therebetween for example elongated seals between abutting faces of the platforms so that leakage will be minimised when the platform assembly 16 is flooded with water. Some leakage however is allowable and preferred so that when it is required to refloat the platform assembly 16, the platform assembly 16 will be self draining and move back to its operative position due to the buoyancy of the platforms 15

In use, the platform assembly 16 normally floats on the water within the reservoir 14 so that the reflectors 17 concentrate solar energy on the target 18 when the sun is shining so as to generate superheated steam from water supplied to the target 18. Superheated steam is fed to the steam turbine ST for driving the generator G1 for the generation of electricity. Should weather conditions indicate the possibility of damage to the reflectors 17 caused for example by hail or strong winds either when the apparatus 10 is operating or not operating, water is supplied onto the top surface of the platform assembly 16 for example by being pumped from a further reservoir 14. Water supplied onto the platform assembly 16 will be constrained within the boundaries of the platform assembly 16 by the raised peripheral barrier or wall 19 and thereby cause water to spread out over the surface of the platform assembly 16 and ensure that an even depth of protective water will be provided over all of the reflectors 17. Leakage of water from the platforms assembly 16 will be relatively small so that continued supply of water to and flooding of the platform assembly 16 will overcome any leakage. Thus, the reflectors 17 will be submerged within water such that they will all be effectively protected by water of a depth as indicated by reference numeral 20 in FIG. 2. In addition, the increased weight of the platform assembly 16 because of water being constrained on the platform assembly 16 within the barrier or wall will cause at least partial sinking of the platform assembly 16 in the reservoir and displacement of water and the level of water within the reservoir 14 to rise as indicated by the numeral 21.

Figure 1:
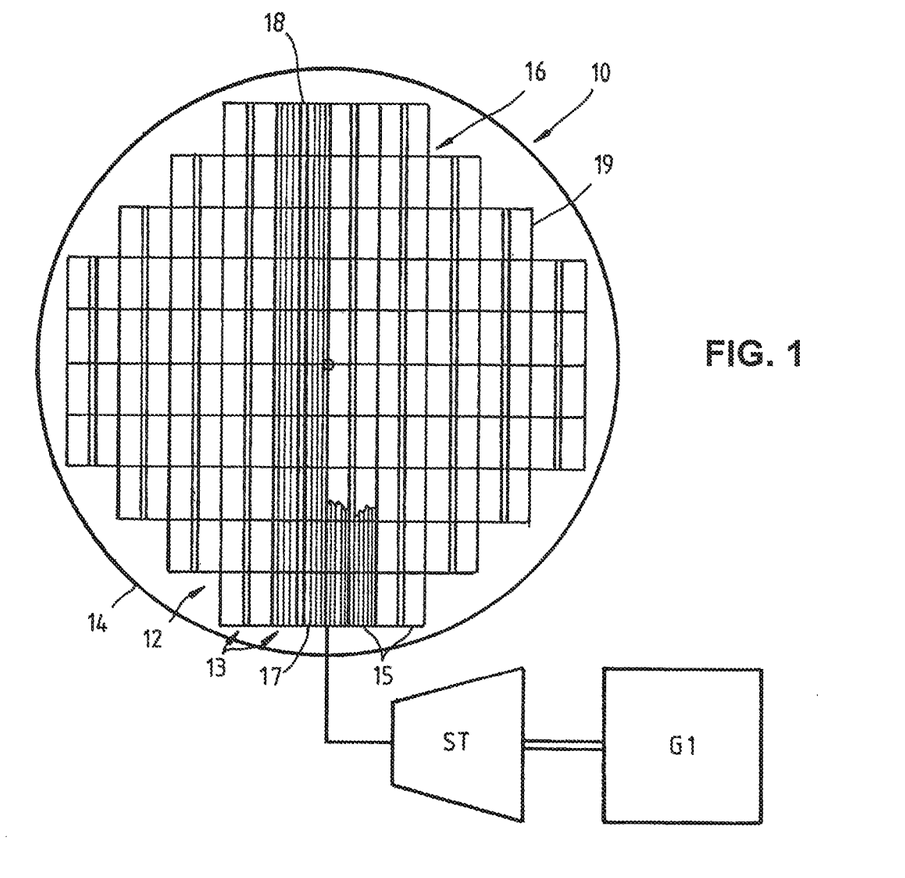
FIG. 1 is a schematic plan view of a solar energy collecting apparatus incorporating a floating platform assembly carrying concentrators or reflectors and as used in a solar thermal power system according to an embodiment of the invention.
Figure 2:
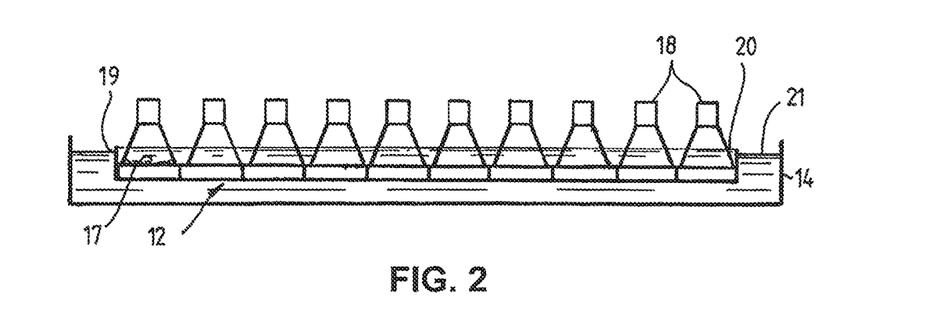
FIG. 2 is a schematic side view of the apparatus of FIG. 1 with the platform assembly flooded with liquid.
Figures 3, 3A:
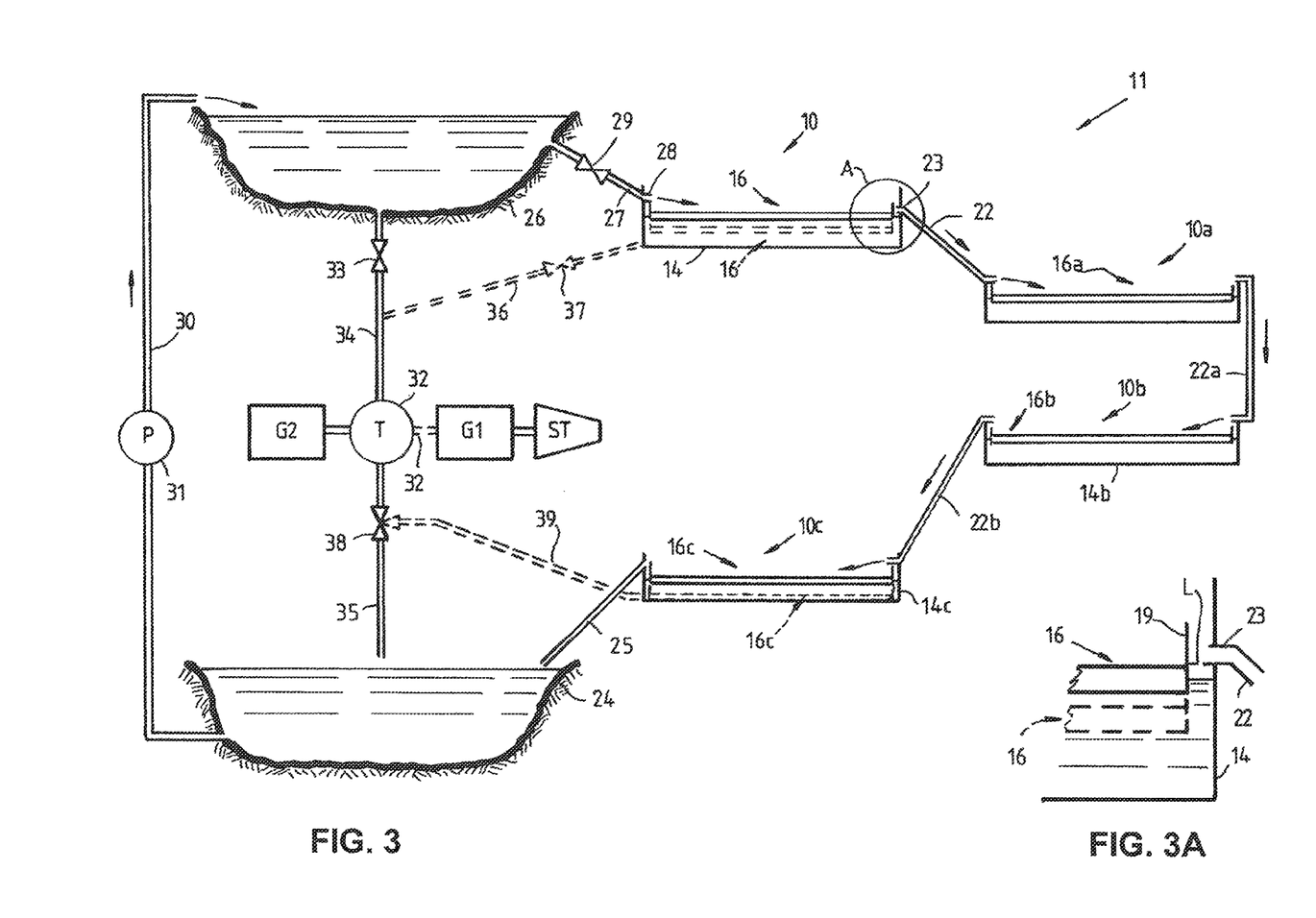
FIG. 3 illustrates schematically a solar thermal power system incorporating a plurality of solar collecting apparatuses of the type illustrated in FIGS. 1 and 2.
FIG. 3A is an enlarged view of the region A of FIG. 3.

The solar thermal power system 11 as shown in FIG. 3 comprises a plurality of thermal solar energy collecting apparatuses 10, 10a, 10b and 10c of the type described in FIGS. 1 and 2, each of which can supply superheated steam to a common steam turbine ST. Each apparatus 10, 10a, 10b and 10c includes a reservoir 14, 14a, 14b and 14c respectively which contain liquid usually water on which the platform assemblies 16, 16a, 16b and 16c float, each platform assembly carrying reflectors or concentrators 17 as described with reference to FIGS. 1 and 2. The respective solar energy collecting apparatus 10, 10a, 10b and 10c are sited or constructed such that the reservoirs 14, 14a, 14b and 14c of respective apparatuses 10, 10a, 10b and 10c are positioned at different elevations one below the other as indicated schematically in FIG. 3. For flooding of each platform assembly 16, 16a, 16b and 16c to protect the reflectors 17 carried thereon in inclement weather conditions as described above, the respective reservoirs 14, 14a, 14b and 14c are connected in series in a cascading relationship such that water or liquid displaced from one reservoir 14, 14a, and 14b can be directed respectively onto the platform assembly 16a, 16b and 16c in the next lower reservoir 14a, 14b and 14c in turn.

Fluid connection between the solar energy collecting apparatuses is provided by a first duct 22 which extends from the reservoir 14 of the first apparatus 10 to the next lower reservoir 14a. The duct 22 has an inlet 23 which intersects or communicates with the reservoir 14 at a position above the normal level of water in the reservoir 14 such that when the platform assembly 16 in that reservoir 14 is flooded with water as described above, the platform assembly 16 moves towards at least a partially submerged position within water in the reservoir 14 as indicated in dotted outline in FIGS. 3 and 3A (and as also shown in FIG. 2). The water displaced by the platform assembly 16 will causes the water level in the reservoir 14 to rise to or beyond a level L which is at the level of the duct inlet 23. The displaced water will then flow into the duct inlet 23 and out of the reservoir 14 through the duct 22 onto the platform assembly 16a of next reservoir 14a under the influence of gravity. Similar ducts 22a and 22b provide communication between the reservoirs 14a and 14b, and 14b and 14c respectively in a similar manner to that described above.

Thus when the platform assembly 16 and reflectors 17 carried thereby are flooded as described above, water flowing through the duct 22 is supplied to the upper side of the platform assembly 16a to cause that platform assembly 16 and reflectors 17 carried thereby to be flooded and in a similar manner to that described above, the platform assembly 16a will be at least partially submerged and the water in the reservoir 14a displaced thereby will flow through the connecting duct 22a to be supplied onto the platform assembly 16b and flood that platform assembly 16b. Similarly the liquid displaced in the reservoir 14b by the flooded platform assembly 16b will cause the platform assembly 16c to be flooded via the duct 22b. Thus each of the platform assemblies 16, 16a, 16b and 16c will be flooded sequentially in turn so that the reflectors or concentrators 17 on all platform assemblies will be protected by a layer of water.

The solar thermal system 11 also may include a lower storage container or dam 24 and an overflow duct 25 extends from the reservoir 14c to the container or dam 24 and is positioned such that liquid displaced from the reservoir 14c by a flooded platform assembly 16c will be directed through duct 25 to the container or dam 24 in a similar manner to the flooding of the platform assemblies 16a and 16b.

The system 11 may additionally include an upper storage reservoir or dam 26 elevated above the dam 24. The dam 26 is also above, or has its liquid level above the level of liquid in, the reservoir 14 of the uppermost solar collecting assembly 10. A supply duct 27 extends from the reservoir or dam 26 to the reservoir 14 and has an outlet 28 positioned to direct water onto the platform assembly 16. A valve 29 controls the supply of water from the dam 26 through the duct 27. Thus to flood all platform assemblies 16, 16a, 16b and 16c, the valve 29 is opened such that liquid flows from the dam 26 onto the platform assembly 16 to cause that platform assembly 16 to be flooded which as described above will cause due to displacement of liquid caused by the submerging platform assemblies, the respective platform assemblies 16a, 16b and 16c to be flooded in turn due to their cascading relationship.

A return line 30 extends between the reservoirs or dams 24 and 26, the line 30 including a pump 31 which can be operated to return a volume of liquid or water from the lower dam 24 to the upper dam 26 to replace the liquid or water released from the dam 26 for flooding the first platform 16.

The system 11 further may include an impulse turbine 32 such as a Pelton wheel turbine which can be supplied with water from the upper reservoir or dam 26 via a selectively operable valve 33 located within a supply/discharge line 34 from the dam 26. Water exiting the turbine 32 is directed to the lower dam 24 via discharge line 35. Water received in the dam 24 can be returned by the pump 31 to the upper dam 26 through the duct 30. The turbine 32 is coupled by any suitable coupling device to an emergency or auxiliary generator G2. Alternatively the turbine 32 may be coupled by a suitable selectively engageable coupling 32' (indicated in dotted outline) to the generator G1 to supplement drive to the generator G1 from the turbine ST.

In normal operation where each solar energy collecting apparatus is exposed to sunlight, water fed to the apparatus will be converted into steam and then into superheated steam in each apparatus 10, 10a, 10b and 10c which is supplied to the turbine ST to drive the generator G1. Power will thus be generated and supplied for example to a community to serve as the power supply for that community. Provided that the sun remains shining, superheated steam will continue to be supplied to the turbine ST to maintain drive to the generator G1 and thus maintain power supply.

In inclement weather conditions for example where hail is expected which could damage the concentrators/reflectors 17, the platform assemblies 16, 16a, 16b and 16c and concentrators/reflectors 17 thereon should be submerged or flooded and for this purpose liquid from the elevated container or dam 26 can be released by operation of the valve 29 to flow under the influence of gravity to the upper side of the platform assembly 16 to flood the platform assembly 16 and thereby cause the platform assembly 16 and concentrators/reflectors 17 thereon to be submerged or flooded with liquid until the risk of damage has passed. As described above, as the platform assembly 16 is flooded, liquid displaced thereby will be directed to the reservoir 14a to flood the platform assembly 16a and similarly the platform assemblies 16b and 16c will be flooded in turn to protect the concentrators/reflectors 17 carried thereby. At any time the pump 31 may be operated to return liquid from the dam 24 to the upper dam or container 26.

When the platform assemblies 16, 16a, 16b and 16c are flooded, the solar energy collecting apparatuses 10, 10a, 10b and 10c will not produce steam to drive the turbine ST. In these circumstances, liquid can be released from the elevated reservoir or dam 26 by operating the valve 33 to supply the impulse turbine 32 which can drive the generator G2 to provide an emergency or auxiliary source of power.

In other circumstances, for example where increased power output is required from the generator G1 for example if insufficient drive is available from the turbine ST, the impulse turbine 32 may be coupled to the generator G1 by coupling 32' and water again released from the dam 26 to drive the turbine 32 and supplement drive to the generator G1.

In an alternative arrangement, the upper reservoir or dam 26 is reduced in volume and surface area so that water is not lost by evaporation but so that there is sufficient water therein to enable the platform assembly 16 to be flooded through the duct 27. In this arrangement, the first reservoir 14 is increased in volume to serve as the primary upper water storage. As the platform assembly 16 substantially occupies and covers the upper surface area of the reservoir 14, there will be little loss of water by evaporation. Similarly the platform assemblies 16a, 6b and 16c will minimise loss by evaporation of water from the other reservoirs 14a, 14b and 14c. Further in this arrangement, a drain duct 36 is provided to extend between the reservoir 14 and duct 34 downstream of the valve 33. Flow through the drain duct 36 is controlled by a valve 37.

Further a three-way valve 38 is provided in the discharge duct 35 from the liquid turbine 32 and a duct 39 is connected between the three-way valve 38 and the reservoir 14c on the underside of the platform assembly 16c. The reservoir 14c can thus serve as a lower storage reservoir for water and replace or partially replace the dam 24 or allow the dam 24 to be reduced in volume. Further the reservoir 14c may be reduced in depth to an extent such that when the platform assembly 16c is flooded, it will sit on the bottom of the reservoir 14c but still have the upper parts of the barrier or wall 19 thereof above water level.

In use in this situation, where inclement weather conditions are expected which could damage the concentrators/reflectors 17, the valve 29 may be opened as previously and allow water from the dam or container 26 to flood the platform assembly 16 with water displaced from the reservoir 14 by the sinking platform assembly 16 flowing through the duct 22 to flood the platform assembly 16a and water displaced from the reservoir 14a flooding the platform assembly 16b. Water displaced from the reservoir 14b will flow through duct 22b to flood the platform assembly 16c which will sink in the reservoir 14c until it sits on the bottom of that reservoir 14c as shown in dotted outline in FIG. 3. Additional flow of water into the reservoir 14c when the platform assembly 16c is sitting on the bottom of the reservoir 14c will fill the volume above the platform assembly 16c defined by the peripheral barrier or wall 19 and then overflow the barrier or wall 19 and start filling the reservoir 14c. If the level of water within the reservoir 14c reaches the duct 25, water will flow therethrough into the dam or container 24.

Where the platform assemblies 16, 16a, 16b and 16c are flooded so that the solar energy collecting apparatuses 10, 10a 10b and 10c are not producing steam to drive the turbine ST, the valve 37 may be opened to allow liquid or water to be released from the uppermost reservoir 14 to supply the impulse turbine 32 which can drive the generator G2 to provide an emergency or auxiliary source of power or supplement drive to the generator G1 via the coupling 32'. In addition, the valve 38 is operated to direct the discharge flow from the turbine 32 via the line 39 to the reservoir 14c which acts as a lower storage tank with overflow from the reservoir 14c flowing into the dam 24. As before, the pump 31 may be operated to return fluid to the dam 26. Alternatively the pump 31 can supply liquid back to the tank 14 where the latter acts as a primary storage reservoir (in place of the reservoir 26).

The apparatus 11 described in the embodiment is shown to have four cascaded reservoirs 14, 14a, 14b and 14c of respective solar collecting apparatuses 10, 10a, 10b and 10c however it will be appreciated that the apparatus 11 may include any number of solar collecting apparatuses arranged at different elevations one below the other, the reservoirs of which being connected in series in a cascading relationship.

As referred to above, the dams 24 and 26 may be eliminated such that the upper reservoir 14 serves as the upper storage container and the lower reservoir 14c serves as the lower storage container. In this embodiment, alternative means may be provided for flooding the first platform assembly 16 which may comprise a smaller volume container or means on the platform assembly 16 itself.

The solar power system 11 has been described in relation to a particular solar thermal energy collection apparatus which normally floats on liquid or water to track movement of the sun. It will be appreciated however that the system of the invention may be applied to any form of solar energy collection apparatus which floats on a body of water or liquid for example a system which uses photovoltaic cells for the generation of power and which can be submerged beneath liquid to protect the cells in inclement weather conditions as described further below.

Figure 4:
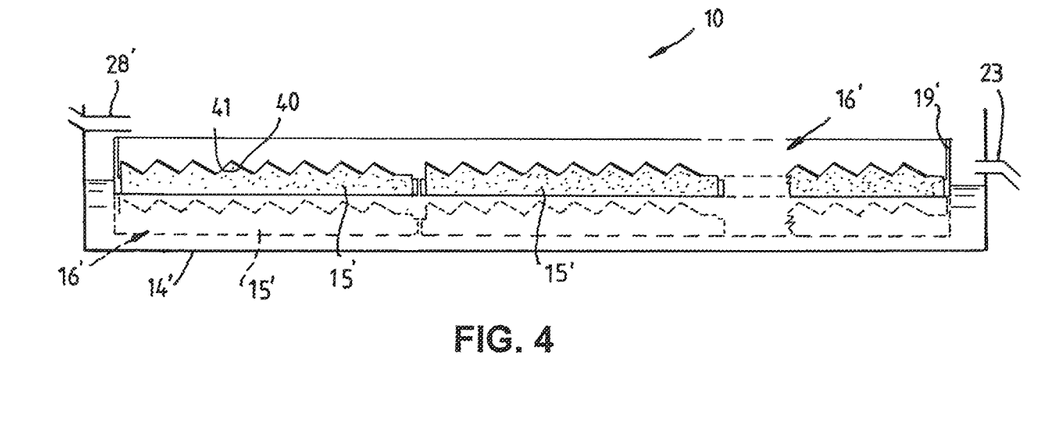
FIG. 4 is a schematic side view of solar energy collection apparatus incorporating photovoltaic cells for use in an alternative embodiment of the invention.

FIG. 4 illustrates in sectional view an alternative embodiment of solar collecting apparatus 10' comprises an array of rectangular buoyant platforms 15' which are designed in this case for carrying photovoltaic cells 40 and which are arranged to float within a reservoir or dam 14'. The platforms 15' may be formed of a buoyant material or provided on their undersides with air compartments. Such an arrangement is disclosed in my International Patent Application No. PCT/AU99/00140. As described in that application, the top side of each platform 15 includes a series of surfaces 41 angled to the mean declination of the sun with each surface 41 carrying photovoltaic cells 40. The platforms 15' are arranged in a floating array with other platforms 15' in a similar configuration to that shown in FIG. 1 to form a platform assembly 16'. The platform assembly 16' can be rotated on liquid or water in the dam or reservoir 14' to follow movement of the sun during the day so that the cells 40 receive maximum exposure to the sun. In an alternative arrangement for supporting the photovoltaic cells, all cells may be arranged in a horizontal attitude or mounted on a support which may be arranged on the platform at an angle to the horizontal. As with the platform assembly of FIGS. 1 and 2, an upstanding barrier or wall 19' is provided around the periphery of the platform assembly 16' which serves to constrain water on the platform assembly 16' for flooding the platform assembly 16' and photovoltaic cells 40. The barrier or wall 19' extends above the surfaces 41 so that the cells 40 can be fully covered or flooded with water.

Each apparatus 10' may be used in the configuration of FIG. 3 replacing each apparatus 10, 10a, 10b and 10c with respective reservoirs 14' arranged in a cascading relationship such that the flooding of one platform assembly 16' will cause the flooding of each lower platform assembly 16' in turn. Thus for each apparatus 10', a water or liquid inlet 28' is provided for directing water onto the platform assembly 16' for example from the dam or reservoir 26 for flooding the platform assembly 16 and providing a protective layer of water over the photovoltaic cells 40 to a maximum level defined by the barrier or wall 19'. This will cause at least partial sinking of the platform assembly 16' within the reservoir 14' as shown in dotted outline and thus increase in the level of water in the reservoir 14' due to displacement caused by the platform assembly 16' until the water level reaches the outlet 23 through which the displaced water is directed to the next lower apparatus 10'. This thus functions to flood all platform assemblies 16' sequentially in the same manner as described with reference to FIGS. 3 and 3A. The inherent buoyancy of the platforms 15' wall cause the platform assemblies 16' to float back to an operative position. Alternatively, air may be injected or supplied to the air compartments in the platforms 15' where provided to increase platform buoyancy.

The reservoirs 14, 14a, 14b and 14c may be purpose constructed containers or may themselves be defined by dams. Similarly the dams 24 and 26 may be defined by any form of liquid container. Most commonly, the reservoirs contain water on which the respective platform assemblies float but may contain other liquids. Thus the reference to "water" throughout the specification includes any liquid.

The platform assembly 16 may comprise any number of interconnected platforms 15 or may comprise a large single platform which carries the reflectors/collectors of the solar energy collecting apparatus.

The reference herein to prior art including prior applications and patents is not be taken as an admission that such prior art constitutes common general knowledge in the art.

The terms "comprising" or "comprises" as used throughout the specification and claims are taken to specify the presence of the stated features, integers and components referred to but not preclude the presence or addition of one or more other feature/s, integer/s, component/s or group thereof.

Whilst the above has been given by way of illustrative embodiment of the invention, all such variations and modifications thereto as would be apparent to persons skilled in the art are deemed to fall within the broad scope and ambit of the invention as herein defined in the appended claims.

The invention claimed is:

1. A solar power system comprising a plurality of solar energy collecting means, each said collecting means comprising a platform assembly floating on liquid in a liquid reservoir, said platform assembly carrying solar energy concentrators or collectors, means for directing liquid onto each platform assembly for flooding said platform assembly and to submerge said concentrators or collectors for protection of said concentrators or collectors under liquid, respective said reservoirs being arranged in a cascading relationship such that the liquid displaced by the flooding of a platform assembly causes the flooding of an adjacent lower platform assembly.

2. A system as claimed in claim 1 wherein said solar energy collecting means includes an uppermost solar energy collecting means and at least one lower solar energy collecting means and wherein flooding of the platform assembly of the uppermost solar energy collecting means causes at least the partial submerging of that platform assembly in its associated reservoir with liquid displaced thereby causing the flooding and at least partial submerging of the platform assemblies of the respective lower solar collecting means in turn such that all platform assemblies can be flooded.

3. A system as claimed in claim 2 and including an upper storage reservoir or dam which contains liquid for flooding the platform assembly of the uppermost solar collecting means, and a lower storage reservoir or dam.

4. A system as claimed in claim 3 wherein the reservoir of the uppermost solar collecting means comprises said upper storage reservoir or dam.

5. A system as claimed in claim 3 wherein said lower storage reservoir or dam receives and stores liquid which is displaced from the lowermost of the at least one lower solar collecting means.

6. A system as claimed in claim 3 wherein the reservoir of the lowermost of the at least one lower solar collecting means comprises wholly or partly said lower storage reservoir or dam.

7. A system as claimed in claim 3 wherein selectively operable pump means are provided to return liquid from the lower storage reservoir or dam to the upper storage reservoir or dam.

8. A system as claimed in claim 1 wherein respective ducts interconnect the reservoirs of the respective solar energy collecting means such that the liquid displaced by the flooding of a platform assembly can flow to the reservoir of adjacent lower solar energy collecting means to flood the platform assembly therein.

9. A system as claimed in claim 1 wherein said solar energy concentrators or collectors comprise reflectors or mirrors of solar energy collecting means which is adapted to generate superheated steam for supply to a steam turbine which uses the superheated steam to generate rotary motion to drive generator means and wherein an upstanding wall or barrier is provided around the periphery of each platform assembly for maintaining liquid on said platform assembly.

10. A system as claimed in claim 1 wherein said solar energy concentrators or collectors comprise photovoltaic cells.

11. A system as claimed in claim 3 and including an impulse turbine for generating rotary motion from liquid released from the upper storage reservoir or dam.

12. A system as claimed in claim 11 and including means for directing liquid from said impulse turbine to said lower storage reservoir or dam.

13. A system as claimed in claim 11 and including means for coupling said impulse turbine to generator means.

14. A system as claimed in claim 1 wherein said solar energy collectors or concentrators of each said platform assembly comprise reflectors or concentrators for concentrating solar energy on a solar energy receiver for the generation of superheated steam and wherein flooding of respective said platform assemblies submerges the reflectors or concentrators in water or liquid to protect the reflectors or concentrators in inclement weather conditions.

15. Solar energy collecting apparatus comprising a plurality of solar energy collecting means, each said collecting means comprising a platform assembly floating on liquid in a liquid reservoir, said platform assembly carrying solar energy concentrators, reflectors or collectors, means for flooding each said platform assembly for submerging said concentrators, reflectors or collectors beneath liquid, respective reservoirs being positioned at differing elevations and being interconnected sequentially in a cascading relationship such that liquid displaced by the flooding of a platform assembly causes the flooding of at least an adjacent lower platform assembly to protect said concentrators, reflectors or collectors of each said collecting means.

16. The solar energy collecting apparatus as claimed in claim 15 wherein said reservoirs are interconnected through respective ducts which direct liquid displaced from one reservoir to an adjacent lower reservoir and onto the platform assembly of the adjacent reservoir.

17. The solar energy collecting apparatus as claimed in claim 16 and including an upper reservoir for supplying liquid to the uppermost liquid reservoir of said plurality of solar energy collecting means.

18. The solar energy collecting apparatus as claimed in claim 17 and including a lower reservoir for receiving liquid from the lowermost liquid reservoir of said plurality of solar energy collecting means.

19. The solar energy collecting apparatus as claimed in claim 18 wherein said lowermost liquid reservoir is of a depth such that a said platform assembly seats on the bottom of said reservoir when receiving liquid from the adjacent upper liquid reservoir.

20. The solar energy collecting apparatus as claimed in claim 15 wherein each said platform assembly is provide with a peripherally extending upstanding wall or barrier for maintaining liquid on said platform assembly.

* * * * *